United States Patent
Booth, Jr. et al.

(10) Patent No.: US 7,875,919 B2
(45) Date of Patent: Jan. 25, 2011

(54) SHALLOW TRENCH CAPACITOR COMPATIBLE WITH HIGH-K / METAL GATE

(75) Inventors: Roger A. Booth, Jr., Wappingers Falls, NY (US); MaryJane Brodsky, Salt Point, NY (US); Kangguo Cheng, Guilderland, NY (US); Chengwen Pei, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 12/059,174

(22) Filed: Mar. 31, 2008

(65) Prior Publication Data

US 2009/0242953 A1    Oct. 1, 2009

(51) Int. Cl.
*H01L 27/108* (2006.01)
(52) U.S. Cl. ............... 257/301; 257/296; 257/298; 257/300
(58) Field of Classification Search ......... 257/301, 257/296, 298, 300, E27.084, E21.646
See application file for complete search history.

(56) References Cited

U.S. PATENT DOCUMENTS

| | | | | |
|---|---|---|---|---|
| 5,733,810 A * | 3/1998 | Baba et al. | ............ | 438/268 |
| 6,097,061 A * | 8/2000 | Liu et al. | ............ | 257/330 |
| 6,121,106 A * | 9/2000 | Ellis et al. | ............ | 438/386 |
| 6,177,697 B1 * | 1/2001 | Cunningham | ............ | 257/301 |
| 6,277,707 B1 * | 8/2001 | Lee et al. | ............ | 438/430 |
| 6,528,847 B2 * | 3/2003 | Liu | ............ | 257/330 |
| 6,815,751 B2 * | 11/2004 | Brown et al. | ............ | 257/305 |
| 6,825,078 B1 * | 11/2004 | Huang | ............ | 438/242 |
| 6,963,108 B1 * | 11/2005 | Kang et al. | ............ | 257/330 |
| 7,087,486 B2 | 8/2006 | Brown et al. | | |
| 7,091,550 B2 * | 8/2006 | Hsu et al. | ............ | 257/317 |
| 7,384,849 B2 * | 6/2008 | Parekh et al. | ............ | 438/270 |
| 7,504,690 B2 * | 3/2009 | Kelly et al. | ............ | 257/328 |
| 7,518,184 B2 * | 4/2009 | Tran | ............ | 257/330 |
| 7,671,394 B2 * | 3/2010 | Booth et al. | ............ | 257/301 |
| 2001/0042874 A1 * | 11/2001 | Lee et al. | ............ | 257/288 |

* cited by examiner

*Primary Examiner*—Leonardo Andújar
*Assistant Examiner*—Jordan Klein
(74) *Attorney, Agent, or Firm*—Joseph P. Abate; Howard M. Cohn

(57) ABSTRACT

Forming a shallow trench capacitor in conjunction with an FET by forming a plurality of STI trenches; for the FET, implanting a first cell well having a first polarity between a first and a second of the STI trenches; for the capacitor, implanting a second cell well having a second polarity in an area of a third of the STI trenches; removing dielectric material from the third STI trench; forming a gate stack having a first portion located between the first and the second of the STI trenches and a second portion located over and extending into the third trench; and performing a source/drain implant of the same polarity as the second cell well, thereby forming a FET in the first cell well, and a capacitor in the second cell well. The second polarity may be opposite from the first polarity. An additional implant may reduce ESR in the second cell well.

7 Claims, 6 Drawing Sheets

SHALLOW TRENCH CAPACITOR COMPATIBLE WITH HIGH-K / METAL GATE

FIELD OF THE INVENTION

The invention relates to semiconductor devices and, more particularly to forming capacitors, such as decoupling capacitors.

BACKGROUND OF THE INVENTION

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET).

The terminals of a field effect transistor (FET) are commonly named source, gate and drain. In the FET, a small amount of voltage is applied to the gate (G) in order to control current flowing between the source (S) and drain (D). In FETs, the main current appears in a narrow conducting channel formed near (usually primarily under) the gate. This channel connects electrons from the source terminal to the drain terminal. The channel conductivity can be altered by varying the voltage applied to the gate terminal or by enlarging or constricting the conducting channel and thereby controlling the current flowing between the source and the drain.

FIG. 1 illustrates a FET 100 comprising a p-type substrate (or a p-well in the substrate), and two spaced-apart n-type diffusion areas—one of which will serve as the "source", the other of which will serve as the "drain" of the transistor.

The space between the two diffusion areas is called the "channel". The channel is where current flows, between the source (S) and the drain (D). A schematic symbol for an n-channel MOSFET appears to the left of FIG. 1.

A thin dielectric layer is disposed on the substrate above the channel, and a "gate" structure (G) is disposed over the dielectric layer, thus also atop the channel. (The dielectric under the gate is also commonly referred to as "gate oxide" or "gate dielectric".)

Electrical connections (not shown) may be made to the source (S), the drain (D), and the gate (G). The substrate may be grounded or biased at a desired voltage depending on applications.

Generally, when there is no voltage applied to the gate, there is no electrical conduction (connection) between the source and the drain. As voltage (of the correct polarity, plus or minus) is applied to the gate, there is a "field effect" in the channel between the source and the drain, and current can flow between the source and the drain. This current flowing in the channel can be controlled by the voltage applied to the gate. In this manner, a small signal (gate voltage) can control a relatively large signal (current flow between the source and the drain).

The FET 100 is exemplary of a MOSFET (metal oxide semiconductor FET) transistor. With the specified "n" and "p" types shown above, an "n-channel MOSFET" can be formed. With opposite polarities (swapping "p" for "n" in the diffusions, and "n" for "p" in the substrate or well), a p-channel FET can be formed. In CMOS (complementary metal oxide semiconductor), both n-channel and p-channel MOS transistors are used, often paired with one another.

While particular n- and p-type dopants are described herein according to NMOS technology, it is to be appreciated that one or more aspects of the present invention are equally applicable to forming a PMOS (generally, simply by reversing the n- and p-type dopants).

An integrated circuit (IC) device may comprise many millions of FETs on a single semiconductor "chip" (or "die"), measuring only a few centimeters on each side. Several chips may be formed simultaneously, on a single "wafer", using conventional semiconductor fabrication processes including deposition, doping, photolithography, and etching.

Decoupling Capacitors

Capacitors which are used for decoupling noise out of power supplies are called "decaps". When a decap is incorporated into an integrated circuit (IC) chip, it can consume significant, valuable chip area. One solution is using deep trench (DT) caps for decoupling applications. DT caps have extremely high capacitance/area density, but also suffer from high equivalent series resistance (ESR).

FIG. 2A illustrates a DT cap, formed in a bottle-neck trench, in a substrate. The trench is filled with polysilicon ("poly", doped to be conductive, herein referred to as "DT Poly"), is lined with a dielectric insulator, and a buried plate (conductive) is formed surrounding the trench by implantation or doping. The substrate may be a SOI-type substrate, having a silicon layer (not shown) over a buried oxide (BOX) layer. Such DT capacitors are commonly used in conjunction with an access device (FET transistor) to form a DRAM cell. The deep trench (DT) has a depth "D" and a width "W".

For decoupling applications, high frequency response of the capacitor is paramount. The high ESR of the DT capacitor means that high frequency performance can be compromised. Typical planar MOS capacitors do not suffer as much from ESR effects, but have low density.

Therefore, and as illustrated by the following prior art, a need exists for a capacitor with higher capacitance per area than planar MOS caps, but with reduced ESR compared to DT caps.

FIG. 2B illustrates a planar (or "flat") MOS cap. This capacitor is formed in a manner similar (substantially identical) to that of a FET, except that the source/drain implantations are of the same polarity as the cell well, and therefore no channel is formed. For example, in a p-type substrate, an n-well is formed. A gate stack comprising a dielectric on the substrate and a conductive (such as poly) structure (electrode) on the dielectric is disposed on the substrate, above the n-well. Source/drain implants are performed, in this case, "n+", the same polarity as the cell well. For a FET, such as shown in FIG. 1, the source/drain implants have opposite polarity from the well, so that a channel is formed. In FIG. 2B, shallow trench isolation (STI) is shown surrounding (and isolating) the capacitor structure, in much the same manner as STI is used to isolate FETs from one another.

Related Patents

U.S. Pat. No. 6,121,106 (IBM, 2000), incorporated by reference herein, discloses a method for forming an integrated trench capacitor. A shallow trench capacitor is disclosed that is fabricated by forming a shallow trench in a substrate extending below a surface of the substrate. A dielectric layer having a preselected thickness is grown in the shallow trench, and a polysilicon layer is deposited over the dielectric layer. The polysilicon layer is then planarized down to the nitride or pad layer forming a capacitor. By utilizing a non-critical mask to open up selected regions, isolation structures may then be formed through shallow trench technology.

U.S. Pat. No. 7,087,486 (IBM, 2006), incorporated by reference herein, discloses method for scalable, low-cost polysilicon capacitor in a planar DRAM. Capacitor structures that have increased capacitance without compromising cell area are provided as well as methods for fabricating the same. A first capacitor structure includes insulating material present in holes that are formed in a semiconductor substrate, where the insulating material is thicker on the bottom wall of each capacitor hole as compared to the sidewalls of each hole. In another capacitor structure, deep capacitor holes are provided that have an isolation implant region present beneath each hole. This patent is a division of U.S. Pat. No. 6,815,751.

Glossary

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

cell well The cell well (sometimes abbreviated "CW") is an area in the silicon substrate that is prepared for functioning as a transistor or memory cell device by doping with an electron acceptor material such as boron or indium (p, electron acceptors or holes) or with an electron donor material such as phosphorous or arsenic (n, electron donors). The depth of a cell well is defined by the depth of the dopant distribution. Usually, the cell well is a big well area for many transistors. Usually, many NFETs will be disposed in one p-well and many PFETs will be disposed in one n-well.

CMP short for chemical-mechanical polishing. CMP is a process, using both chemicals and abrasives, comparable to lapping (analogous to sanding), for removing material from a built up structure. For example, after depositing and etching a number of elements, the top surface of the resulting structure may very uneven, needing to be smoothed (or leveled) out, prior to performing a subsequent process step. Generally, CMP will level out the high spots, leaving a relatively smooth planar surface.

deposition Deposition generally refers to the process of applying a material over another material (or the substrate). Chemical vapor deposition (CVD) is a common technique for depositing materials. Other "deposition" techniques, such as for applying resist or glass, may include "spin-on", which generally involves providing a stream of material to the substrate, while the substrate is spinning, resulting in a relatively thin, flat, evenly-distributed coating of the material on the underlying substrate.

dopant element introduced into semiconductor to establish either p-type (acceptors) or n-type (donors) conductivity; common dopants in silicon: for p-type—boron (B), Indium (In); for n-type—phosphorous (P) arsenic (As), antimony (Sb). Dopants are of two types—"donors" and "acceptors". N type implants are donors and P type are acceptors.

DRAM short for dynamic random access memory. DRAM is a type of random access memory that stores each bit of data in a separate capacitor within an integrated circuit. Since real capacitors leak charge, the information eventually fades unless the capacitor charge is refreshed periodically. Because of this refresh requirement, it is a dynamic memory as opposed to SRAM and other static memory. Its advantage over SRAM is its structural simplicity: only one transistor and a capacitor are required per bit, compared to six transistors in SRAM. This allows DRAM to reach very high density. Like SRAM, it is in the class of volatile memory devices, since it loses its data when the power supply is removed.

crystal, the deposited film takes on a lattice structure and orientation identical to those of the substrate. This is different from other thin-film deposition methods which deposit polycrystalline or amorphous films, even on single-crystal substrates. If a film is deposited on a substrate of the same composition, the process is called homoepitaxy; otherwise it is called heteroepitaxy.

ESR short for equivalent series resistance (sometimes referred to as "electrical series resistance"). In contrast with resistance, per se, ESR is an effective resistance that is used to describe the resistive parts of the impedance of certain electrical components. For example, the theoretical treatment of devices such as capacitors and inductors tends to assume they are ideal or "perfect" devices, contributing only capacitance or inductance to the circuit. However, all physical devices are constructed of materials with finite electrical resistance, which means that physical components contain some resistance in addition to their other properties.

FET short for field effect transistor. The FET is a transistor that relies on an electric field to control the shape and hence the conductivity of a "channel" in a semiconductor material. FETs are sometimes used as voltage-controlled resistors. The terminals of FETs are designated source (S), drain (D) and gate (G). Corresponding voltages applied to these terminals may be referred to as Vs, Vd, Vg, respectively. Substrate voltage may also play a role in FET operation.

ILD short for inter-level (or inter-layer) dielectric. Generally, ILD is a relatively thick layer of oxide deposited on completed underlying structures (such as FETs), which will support a layer(s) of metal lines interconnecting the various underlying structures. Holes may be etched through the ILD and filled with metal to make contact with elements (such as source, drain, gate) of the underlying structures.

lithography In lithography (or "photolithography"), a radiation sensitive "resist" coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example.

MOSFET short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

nitride commonly used to refer to silicon nitride (chemical formula Si3N4). A dielectric material commonly used in integrated circuit manufacturing. Forms an excellent mask (barrier) against oxidation of silicon (Si). Nitride is commonly used as a hard mask (HM).

oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films are obtained by thermal oxidation of silicon. Thermal SiO2 forms a smooth, low-defect interface with Si, and can be also readily deposited by CVD. Oxide may also be used to fill STI trenches, form spacer structures, and as an inter-level dielectric, for example.

poly short for polycrystalline silicon (Si). Heavily doped poly Si is commonly used as a gate contact in silicon MOS and CMOS devices.

p-type semiconductor in which concentration of "holes" is higher than the concentration of electrons. See n-type. Examples of p-type silicon include silicon doped (enhanced) with boron (B), Indium (In) and the like.

resist short for photoresist. also abbreviated "PR". Photoresist is often used as a masking material in photolithographic processes to reproduce either a positive or a negative image on a structure, prior to etching (removal of material which is not masked). PR is usually washed off after having served its purpose as a masking material.

spacer a spacer, as the name implies, is a material (such as a layer of oxide) disposed on an element (such as a poly gate electrode). For example, sidewall spacers disposed on opposite sides of a gate electrode structure cause subsequent implants to occur further away from the gate than otherwise (without the spacers in place), thereby controlling (increasing) the length of a channel under the gate electrode structure.

STI short for shallow trench isolation. Generally, a trench etched into the substrate and filled with an insulating material such as oxide, to isolate one region of the substrate from an adjacent region of the substrate. One or more transistors of a given polarity may be disposed within an area isolated by STI.

SUMMARY OF THE INVENTION

The invention is generally directed to a minimal process add "shallow" trench (ST) capacitor. The design of the shallow trench capacitor disclosed herein allows for ESR comparable to planar (MOS) caps, with more than 3× capacitance/area density increase. The shallow trench (ST) capacitor disclosed herein may be slightly more expensive than a MOS cap, but offers better performance than the MOS cap. Compared with deep trench (DT) capacitors, the shallow trench (ST) capacitor is simpler and less expensive to implement, since the DT capacitor etch adds more steps (such as the DT etch itself, and one or more poly depositions), and is thus more expensive. The DT capacitor offers more performance, but only at a cost. Although the DT capacitor may offer more capacitance per top-down area than the ST capacitor disclosed herein, the DT capacitor may have significantly more ESR than the ST capacitor.

According to an embodiment of the invention, a shallow trench capacitor comprises: an STI trench extending into a surface of a substrate and having a depth (d) and a width (w), wherein the depth (d) of the STI trench is less than 5 times the width (w) of the STI trench; a cell well implanted to have a first polarity encompassing the STI trench; the STI trench is filled with a gate stack comprising an insulating layer followed by a conductive layer; the gate stack is patterned so as to have a portion located over the trench; and source/drain implantations in the substrate on opposite sides of the trench and having the same polarity as the trench. The trench may have a depth (d) of approximately 200-300 nm, and a width (w) of at least 100 nm. An additional implant of the first polarity may be performed to increase the doping level in the cell well in adjacent the STI trench. The insulating layer may comprise a high-k dielectric material. The conductive layer may comprise a metal layer and an overlying poly layer. Sidewall spacers may be disposed on sidewalls of the patterned gate stack.

According to an embodiment of the invention, a method of forming a shallow trench capacitor in conjunction with an FET comprises: forming a plurality of STI trenches; for the FET, implanting a first cell well having a first polarity between a first and a second of the STI trenches; for the capacitor, implanting a second cell well having a second polarity in an area of a third of the STI trenches; forming a gate stack having a first portion located between the first and the second of the STI trenches and a second portion located over the third trench; and performing a source/drain implant of the same polarity as the second cell well, thereby forming a FET in the first cell well, and a capacitor in the second cell well. The second polarity may be opposite from the first polarity. An additional implant may reduce ESR in the second cell well. Sidewall spacers may be formed on the FET gate stack.

According to an embodiment of the invention, a method of forming a capacitor in an integrated circuit chip comprises: form shallow trench isolations (STIs) comprising shallow trenches filled with oxide; implant at least one cell well, a portion of which is a cap well and another portion of which is a FET well; remove the oxide fill from a given one of the shallow trenches in the cap well; and deposit a gate stack comprising: a layer of insulating material; and a layer of a conductive material; wherein the insulating material lines the given one of the shallow trenches in the cap well, and the metal at least partially fills the given one of the shallow trenches in the cap well; patterning the gate stack to have two portions, a first portion over the FET well which will serve as a gate stack for a FET, and a second portion which will serve as a contact to an inner electrode of a capacitor which is formed in the given one of the shallow trenches; and performing source/drain implantation to form a FET comprising source/drain implants and the gate stack for the FET, and to form a buried electrode for the capacitor. An ion implantation may be performed to lower resistance in the cap well. The insulating material may comprise a high-k dielectric material. The conductive material may comprise a metal layer followed by a cap layer of polysilicon. Sidewall spacers may be formed on at least the gate stack for the FET. The cap well may be of opposite polarity from the FET well. The source/drain implantation for the cap well may be the same as for the FET well, and thereby no channel between the source/drain implantation in the cap well. The cap well may be an n-well; the FET well may be a p-well; and the source/drain implantation is n-type (n+).

According to an embodiment of the invention, this invention offers significant improvement of the prior art described above, in that it requires minimal process added to standard CMOS techniques, and has optimized dielectric for both the capacitor and STI regions—that is, the capacitor and STI have separate dielectric depositions.

Furthermore, high-k dielectric and metal fill can be used in the shallow trench capacitor for further performance enhancement, without impact to the standard high-k/metal gate process.

Furthermore, the shallow trench capacitor provides superior high-frequency performance without using extra ion implantation process.

The aforementioned U.S. Pat. No. 6,121,106 describes a shallow trench capacitor aimed at DRAM, however it could also be used for decoupling. The process presented in this patent is somewhat invasive to the base process in that it requires additional poly deposition above prior art planar gate oxide capacitor. Also this patent requires that the STI liner be the same as the dielectric in the capacitor, which may impose process and/or reliability difficulty. Further, high-k dielectric can not be used for capacitance enhancement in this prior art.

Therefore, a need exists for a simplified structure which removes the constraints shown above, and makes more use to typical process sequence.

The aforementioned U.S. Pat. No. 7,087,486 also discloses a capacitor formed in a shallow trench, but suffers from similar issues described for the '106 patent, and does not fully address the needs described for the above prior art. Additionally, the thick dielectric at the bottom of the trench described in this patent will reduce the available capacitance of the structure.

In some of the figures, particularly cross-sectional views of semiconductor devices in various stages of fabrication, some elements may be drawn with very straight edges intersecting with other edges at precise (such as 90-degree) angles, for illustrative clarity. One of ordinary skill in the art will appreciate that the edges.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

In some of the figures, particularly cross-sectional views of semiconductor devices in various stages of fabrication, some elements may be drawn with very straight edges intersecting with other edges at precise (such as 90-degree) angles, for illustrative clarity. One of ordinary skill in the art will appreciate that they may not be so straight, and the intersections may be rounded, due to the nature of the processes (such as etching) used to form the various elements of the semiconductor devices.

Figure 1:
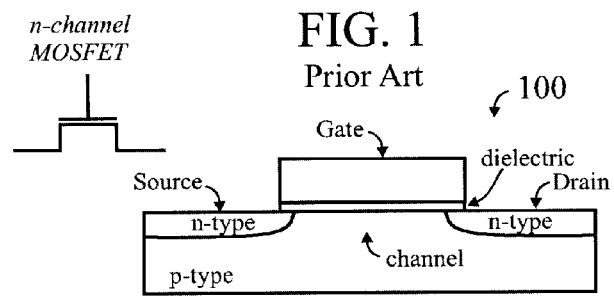

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199a, 199b, 199c, etc. Such relationships, if any, between similar elements in the same or different figures will become apparent throughout the specification, including, if applicable, in the claims and abstract.

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and there is a dot at the intersection of the two lines are connected with one another, else (if there is no dot at the intersection) they are typically not connected with one another.

In the drawings accompanying the description that follows, both reference numerals and legends (labels, text descriptions) may be used to identify elements. If legends are provided, they are intended merely as an aid to the reader, and should not in any way be interpreted as limiting.

FIG. 1 is a cross-sectional view of a FET, according to the prior art.

Figure 2A:
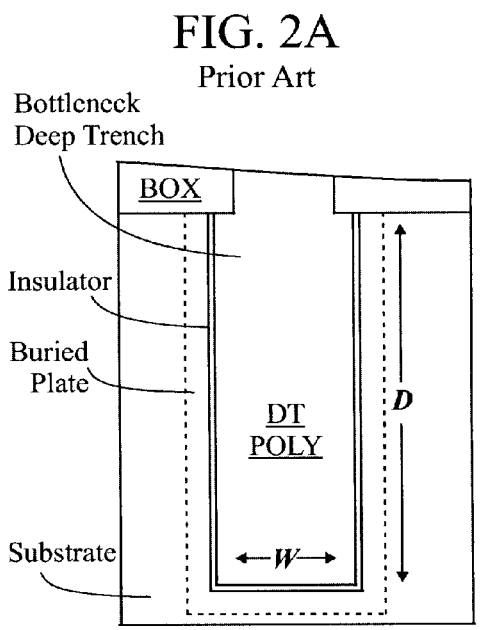

FIG. 2A is a cross-sectional view of a deep trench (DT) capacitor, according to the prior art.

Figure 2B:
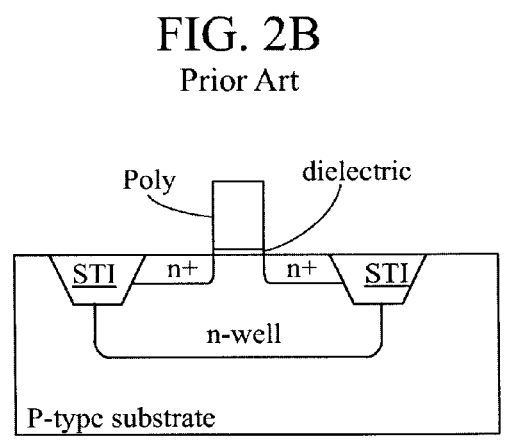

FIG. 2B is a cross-sectional view of a planar MOS capacitor, according to the prior art.

FIGS. 3A-3G are cross-sectional views of a process for forming a shallow trench capacitor, according to an embodiment of the invention.

Figure 4:
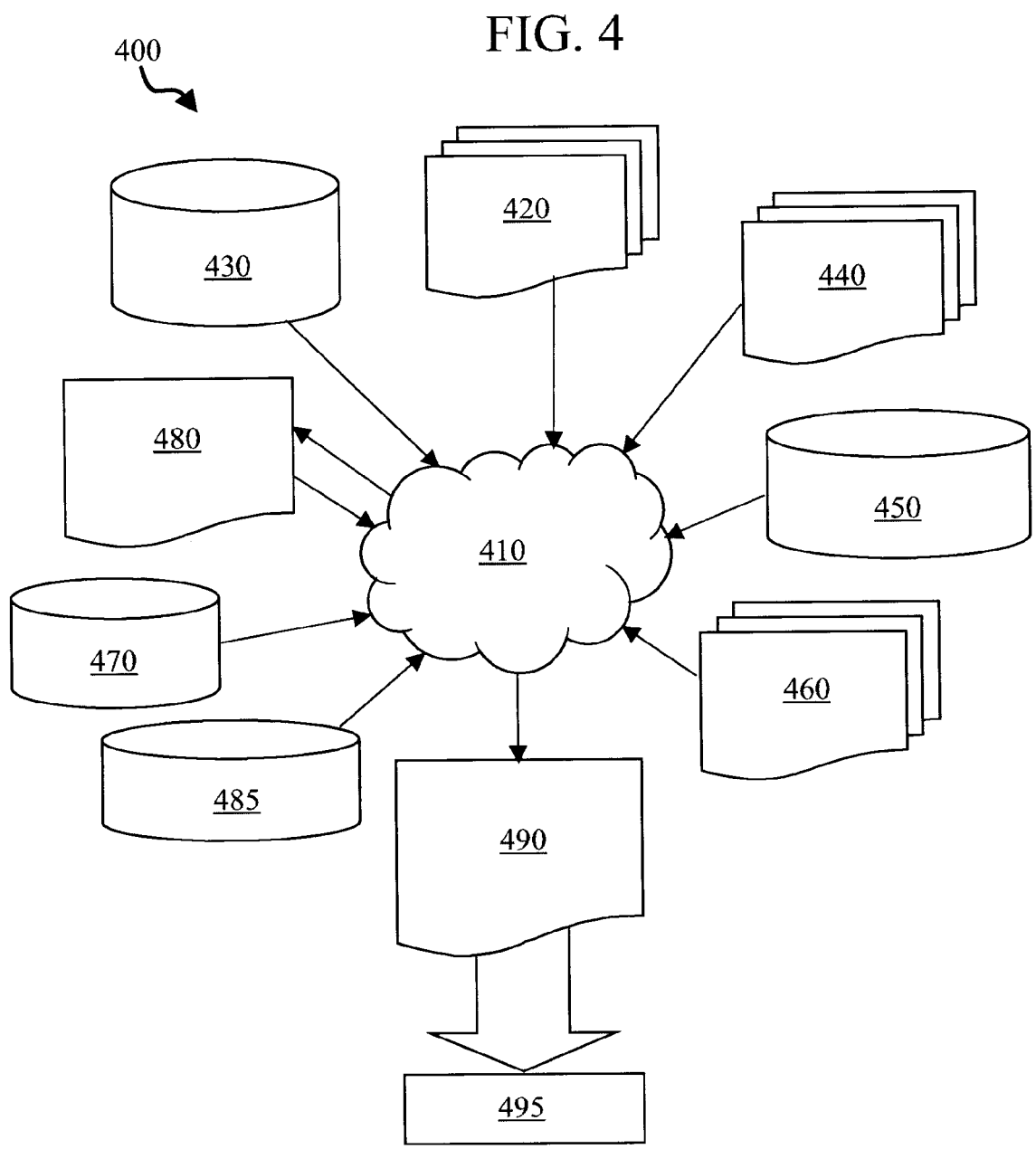

FIG. 4 is a flow diagram of a design process used in semiconductor design, manufacturing, and/or test.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

Throughout the descriptions set forth in this disclosure, lowercase numbers or letters may be used, instead of subscripts. For example Vg could be written Vg. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "Vs" (source voltage) or "H2O" (water). For consistency of font size, such acronyms may be written in regular font, without subscripting, using uppercase and lowercase—for example "Vs" and "H2O".

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula SiO2. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith.

As used herein, the term semiconductor fabrication or process or device may refer to standard CMOS processing and devices. CMOS is a widely used type of semiconductor product that uses both NMOS (negative polarity) and PMOS (positive polarity) devices and circuits. Generally, unless otherwise stated, the polarities of any device disclosed herein may be reversed, "p" for "n", which may (or may not) require that other associated devices are also implemented with opposite polarity.

An exemplary process will be described for forming Shallow Trench Capacitor compatible with High-K/Metal Gate, generally comprising the following steps:
   Form shallow trench isolations (STIs)
   Well ion implantation
   Remove STI fill from capacitor area
   Deposit high-K/metal gate stack simultaneously filling the empty STI
   Pattern gate
   Source/drain implantation
   Form contacts This disclosure describes additional steps which may be added to a conventional CMOS process to form a shallow trench (ST) capacitor. Other conventional CMOS process steps are well known, and may be omitted, for descriptive clarity.

Figure 3A:
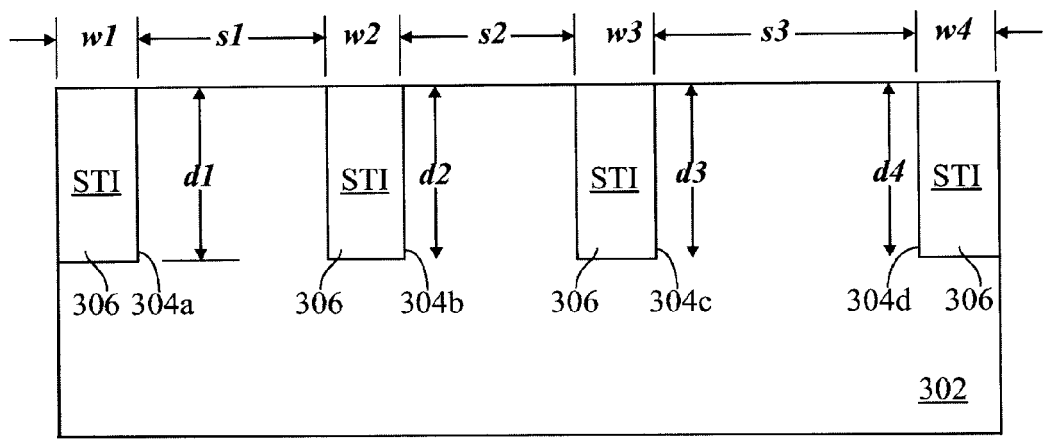

FIG. 3A illustrates a first step (form STI) in the process. Beginning with a substrate 302, such as a silicon substrate (which may or may not be an SOI substrate), shallow trenches 304a, 304b, 304c and 304 (which may generally be referred to as "304") are formed and filled, using conventional shallow trench isolation processes. The trenches 304 may be filled with conventional trench oxide 306 (labeled "STI"). (Typically, for forming STI, there is a thin liner of oxide or nitride, then a thick deposition of oxide, a CMP, and a recess etch.)

The trenches 304 extend into the substrate 302, from a top surface thereof. The trenches 304 may extend substantially uniformly to a depth "d" into the substrate, although four individual depths "d1", "d2", "d3" and "d4" are shown.

The trenches 304 may each have the same width "w" as one another, although individual widths "w1", "w2", "w3" and "w4" are shown.

The trenches 304 may be uniformly or non-uniformly spaced from one another—for example, a distance "s1" between the trenches 304a and 304b, a distance "s2" between the trenches 304b and 304c, and a distance "s3" between the trenches 304b and 304c.

In the top view, the trenches may be rectangular, or they may be ring-shaped, like conventional STI (surrounding an active area).

The following dimensions for the trenches 304 are exemplary:
   depth "d"=approximately 200-300 nm
   width "w"=approximately 100 nm-several thousand nm (several microns)
   spacing "s1"=approximately 80-1000 nm
   spacing "s2"=approximately 80-1000 nm
   spacing "s3"=approximately 80-1000 nm It should be noted here that the shallow trenches 304 are significantly different than the deep trench described above with respect to FIG. 2A, and the difference is not merely one of "scaling". Also involved are process steps required to make the respective shallow and deep trenches.

For example, shallow trench processes are part of normal CMOS processes. The steps involved in forming deep trenches are not. Different masks, different chemistries, and different subsequent steps (such as how many poly steps) may be required. In semiconductor fabrication, there is generally a high cost involved in adding steps, and when an existing step can be "leveraged", that can be of great benefit.

The deep trench has a depth "D" of approximately 2000-5000 nm (2-5 microns), a width "W" of approximately 50-175 nm, is much deeper than it is wide, having an aspect ratio (D:W) of approximately 40:1. Note that the shallow trenches 304 disclosed herein, have a depth "d" of 200-300 nm, a width of at least 100 nm (can be as wide as desired), resulting in an aspect ratio (d:w) of approximately at most 3:1, more typically 2:1 or lower, such as 1:1. This is at least an order of magnitude (factor of 10) difference in aspect ratio between deep trench and shallow trench and, as mentioned above, required a different "suite" of semiconductor fabrication tools and processes to achieve. The STI is part of a conventional CMOS process flow. DT is not. In other words, the depth (D) of a deep trench is approximately 30 or 40 times its width, and the depth (d) of a shallow trench is less than 5, such as less than 3, less than 2 or less than 1 times its width.

In the steps that follow, a capacitor will be formed in the shallow trench 304b. In one of the steps (FIG. 3C), the STI oxide will be removed from the trench 304b, and in subsequent steps the trench will be lined with an insulator, filled with a conductor, and an area surrounding the trench will be doped to act in the manner of a buried plate, as described in greater detail hereinbelow. All of this will be done using substantially conventional CMOS fabrication steps and process flow.

The MOS cap described above with respect to FIG. 2B also benefits from leveraging conventional CMOS fabrication steps, but the capacitance is relatively diminutive (low) as compared with the capacitance which can be achieved by fabricating a capacitor in an STI trench, as disclosed herein.

Figure 3B:
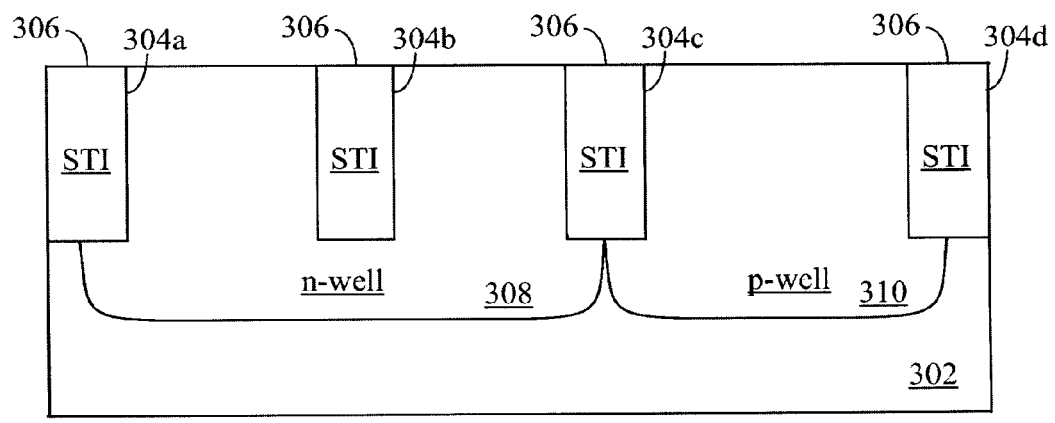

FIG. 3B illustrates a next step (well ion implantation) in the process. An n-well 308 is implanted between trenches 304a and 304c, and encompasses (surrounds) the trench 304b. A p-well 310 is implanted between trenches 304c and 304d. A capacitor will be formed in the n-well area 308, as described in the following step(s). An NFET will be formed in the p-well area 310, as described in the following step(s).

It should be understood that the figures presented herein are cross-sectional views and, as such, what is shown as two trenches 304c and 304d may be two opposite sides of a trench which is rectangular (in top view) which surrounds (on all four sides) an active area of the substrate for forming one or more FETs. In this example, only one FET will be shown formed in the active area between the trench(es) 304c/304d.

These polarities (n and p) of the cell wells 308 and 310 could be reversed, so that the capacitor well 308 is a p-well and the FET well 310 is an n-well for PFET. Or, the capacitor well 308 could be of the same polarity (n or p) as the FET well 310, rather than being of complementary polarity. The example here will be showing an NFET formed in the p-well 310, and a capacitor formed in the other well 308 which may be formed using substantially the same CMOS processes (materials and steps). If the two wells 308 and 310 are of the same polarity, they could be one large cell well encompassing the two areas illustrated. However, the capacitor well 308 is going to receive an additional implant in a subsequent step.

Figure 3C:
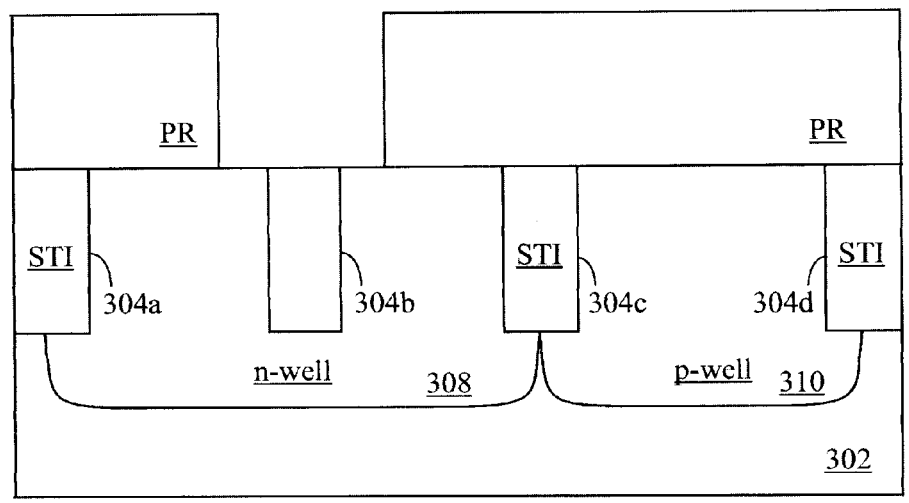

FIG. 3C illustrates a next step (remove STI for capacitor) in the process. A mask, such as photoresist PR is deposited and patterned to expose an area above the capacitor well 308 between (but not including) the trenches 304a and 304c. The exposed area includes the trench 304b. Using a suitable etch process, the STI fill 306 is removed from the trench 304b. A hard mask could be used in lieu of the photoresist mask.

This step of removing the fill from the STI trench 304b represents the "major" deviation from a standard CMOS process, and may simply require one extra mask and etch.

With the mask in place, an ion implantation may optionally be performed to lower the n-well 308 resistance in an area of the cell well 308 adjacent the trench 304b. In the case the capacitor well 308 is an n-well, this additional implantation would be n-type (same polarity as the well) and may be performed to reduce ESR of a resulting capacitor built using the trench 304b. (For a p-well capacitor well 308, a p-type implant would be performed.)

Figure 3D:
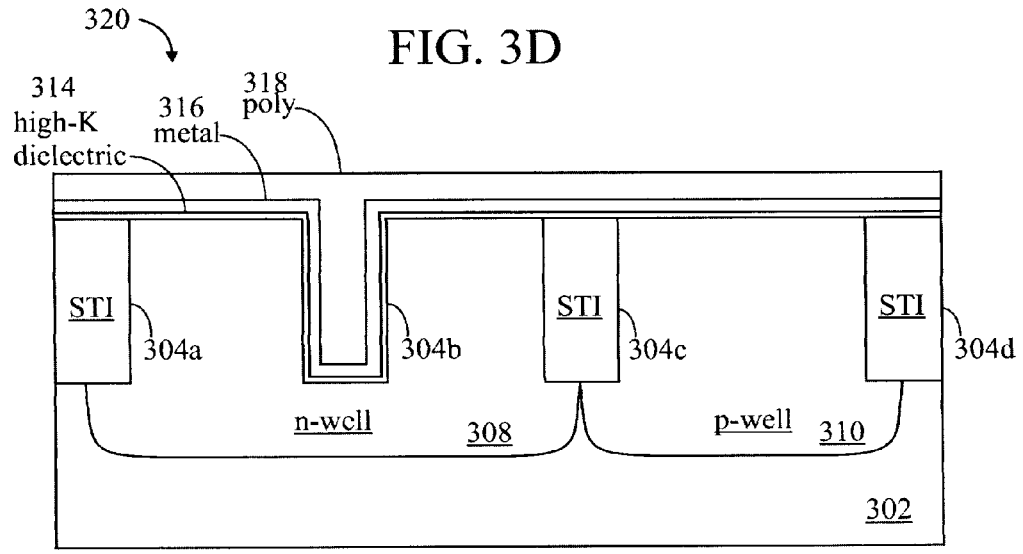

FIG. 3D illustrates a next step (gate stack) in the process. A gate stack 320 may be formed, using conventional processes, as follows.

First, a high-k dielectric layer 314, such as hafnium oxide (HfO2) is deposited, such as to a thickness of approximately 20 Å (2 nm). This insulating material 314 lines (covers the exposed inner surfaces of) the trench 304b, including walls and bottom, as illustrated.

It should be noted that this dielectric layer 314 will serves as the gate dielectric for an NFET to be formed in the p-well 310. Any suitable high-k dielectric material (generally defined as having a "k" greater than that of oxide, or k>~3.9) may be used in this step. A benefit of the process disclosed herein is that the same high-k dielectric material used as the gate dielectric of the NFET will also serve as an insulator between the two conductive electrodes of a capacitor to be formed in the p-well 308. Oxide, which is not "high-k" could also be used.

Next, a metal layer 316, such as titanium nitride (TiN) is deposited, such as to a thickness of approximately 200 Å (20 nm). Although not shown, there optionally can be an adjustment oxide (AO) layer deposited underneath, which would be standard for forming a PFET in the n-well 308. But since a PFET is not going to be formed in the n-well (and, in the p-well 310, an NFET will be formed), there is no need for such an AO layer. The metal layer 316 at least partially fills the trench 304b, covering the insulating material 314 on the walls and bottom of the trench, as illustrated.

Next, a poly (polysilicon) cap layer 318 is deposited, such as to a thickness of approximately 500 Å (50 nm). The metal layer 316 and poly cap layer 318 are both conductive layers. Generally, in principle, metal (TiN) alone could be used for the entire gate, but in some process flows it may be difficult to etch that much metal. Hence, after a thin layer of metal, a thicker, more readily etchable layer of poly is used.

These three layers of dielectric 314, metal 316 and poly 318 form a gate stack 320 which will be patterned, in a subsequent step, to serve as a contact for (to an inner electrode of) a capacitor formed in the n-well 308 and as a gate stack for a NFET formed in the p-well 310. Note that the gate stack 320 extends into the trench 304b, taking the place of the original STI dielectric material 306 which was removed from the trench 304b.

Figure 3E:
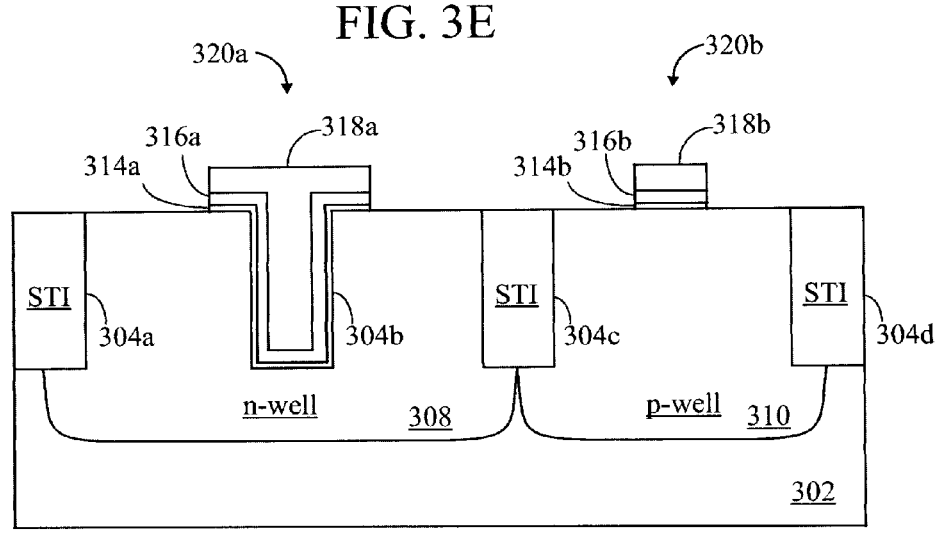

FIG. 3E illustrates a next step (pattern gate stack) in the process. Using a photoresist mask (not shown), appropriately patterned, and an appropriate etch, portions of the gate stack 320 are removed, leaving:

a first portion 320a of the gate stack comprising dielectric 314a, metal 316a and poly 318a is located over the trench 304b, between the STI-filled trenches 304a and 304c, in the cap well (cell well, p-well) 308 area; and a second portion 320b of the gate stack, comprising dielectric 314b, metal 316b and poly 318b is located between the STI-filled trenches 304c and 304d, in the FET well 310 area, which will be the gate stack for an NFET to be formed in the p-well area 310.

Although having a metal layer 316b in the NFET gate stack 320b may be somewhat unusual, it should not compromise the performance of the FET. Again, the choice of NFET or PFET is arbitrary.

Note that the gate stack portion 320a is aligned substantially exactly over the trench 304b, but may be wider, having a width, for example, of 2-3 times the width of the trench 304b, extending widthwise, symmetrically, from both sides of the trench 304b.

Figure 3F:
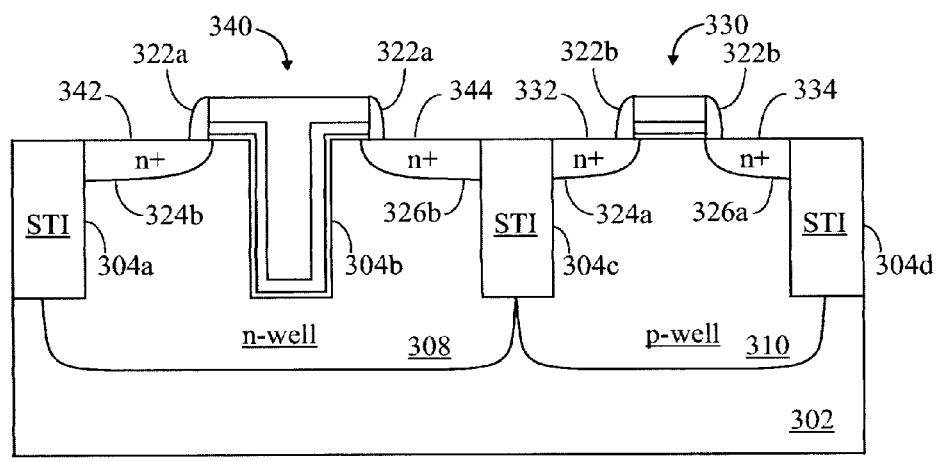

FIG. 3F illustrates a next step (source/drain ion implantation) in the process. Standard CMOS spacers 322b may be formed on the sides of the gate stack 320a, and standard CMOS spacers 322b may be formed on the sides of the gate stack 320b. Then, an ion implantation, also known as "source/drain" implantation is performed to form source and drain 332 and 334 for a FET 330 in the p-well (FET well) 310. The spacers 322a on the sides of the capacitor gate stack 320a are optional, and generally are merely an "artifact" of the conventional CMOS process.

In this example, the FET 330 being formed in the n-well 310 receives the appropriate source/drain implantations (n+) that characterize it as an N-type FET. A corresponding capacitor structure 340 being formed in the n-well 308 will receive the same "n+" implants 342 and 344, the result of which there is no channel between its two "source/drain" implants, so it will not function as a FET—it is not intended to, it is intended to function as a capacitor. The n+ source/drain implants 342 and 344 (in conjunction with the n-well itself, and additional optional n-type implant) will serve as the buried electrode of the capacitor, in the manner of the "buried plate" in a conventional DT capacitor (FIG. 2A). (For a FET, the "channel" between the S/D implants is generally of opposite polarity from the implants.)

For the capacitor, the source/drain implants 342 and 344 are disposed in the substrate on opposite sides of the trench 304b and have the same polarity as the trench (well 308). Thus, although a capacitor 340 formed in the cell well 308 looks somewhat like a FET, an FET has source/drain implants that are of opposite polarity than the well and channel. A "NFET" is formed in a p-well, with n-type source drain implants and a p-type channel therebetween. A "PFET" is formed in a n-well, with p-type source drain implants and a n-type channel therebetween. The capacitor structure 340 being formed here, although it resembles a FET, is a "no-FET" due to the fact that the source/drain implants are of the same polarity as the well and the trench between the source and drain diffusions.

As shown in FIG. 3F, a capacitor 340 has been formed in the n-well 308, and an NFET 330 has been formed in the p-well, using standard CMOS processing. The capacitor 340 may be used as a decoupling capacitor, and need not be connected with or electrically associated with the NFET 330. What is being shown in these figures is that it is possible to make a capacitor using normal CMOS processes, using the STI trench and the same gate poly as for FETs.

As mentioned before, the polarity of the two cell wells 308 and 310 may be reversed (and p+ source/drain implantations performed), to form an PFET in the well 310. And, if the capacitor well 308 is a p-well, the additional implant described above would be p-type.

Figure 3G:
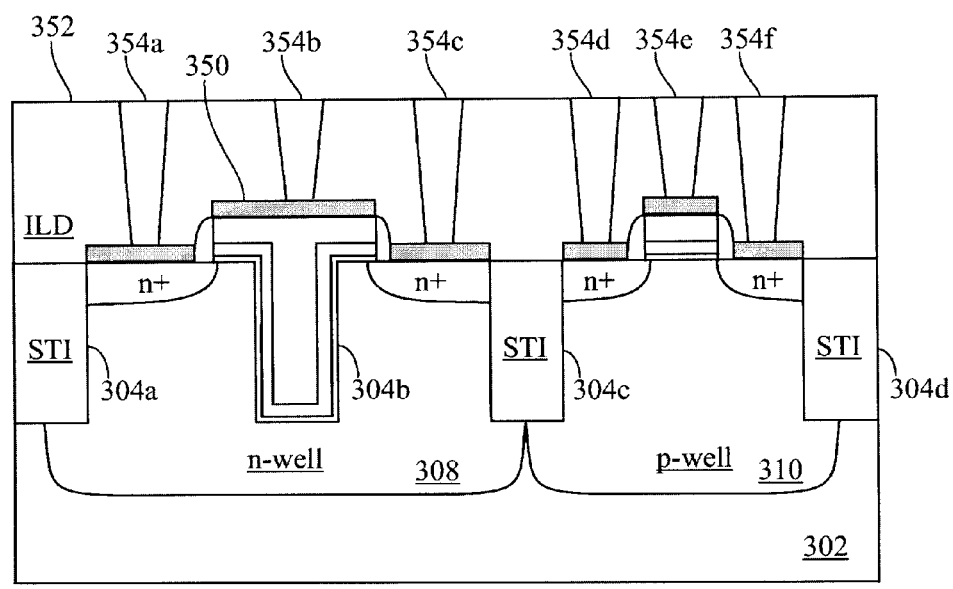

FIG. 3G illustrates a next step (form silicide/ILD and contacts) in the process. Using conventional processes, areas above the source, drain and gate for each of the capacitor 340 and the FET 330 are silicided 350, inter-level dielectric (ILD) 352 is deposited, and appropriate contacts 354a, 354b, 354c, and 354d, 354e and 354f may by formed, as shown.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 420 is preferably an input to a design process 410 and may come from an IP provider, a core developer, or other design company or may be generated by the operator of the design flow, or from other sources. Design structure 420 may comprise FET 330 and capacitor structure 340 in the form of schematics or HDL, a hardware-description language (e.g., Verilog, VHDL, C, etc.). Design structure 420 may be contained on one or more machine readable medium. For example, design structure 420 may be a text file or a graphical representation of FET 330 and capacitor structure 340.

Design process 410 preferably synthesizes (or translates) circuit 100 into a netlist 480, where netlist 480 is, for example, a list of wires, transistors, logic gates, control circuits, I/O, models, etc. that describes the connections to other elements and circuits in an integrated circuit design and recorded on at least one of machine readable medium. This may be an iterative process in which netlist 480 is re-synthesized one or more times depending on design specifications and parameters for the FET 330 and capacitor structure 340. Design process 410 may include using a variety of inputs; for example, inputs from library elements 430 which may house a set of commonly used elements, circuits, and devices, including models, layouts, and symbolic representations, for a given manufacturing technology (e.g., different technology nodes, 32 nm, 45 nm, 90 nm, etc.), design specifications 440, characterization data 450, verification data 460, design rules 470, and test data files 485 (which may include test patterns and other testing information). Design process 410 may further include, for example, standard circuit design processes such as timing analysis, verification, design rule checking, place and route operations, etc. One of ordinary skill in the art of integrated circuit (IC) design can appreciate the extent of possible electronic design automation tools and applications used in design process 410 without deviating from the scope and spirit of the invention. The design structure of the invention is not limited to any specific design flow.

Design process 410 preferably translates an embodiment of the invention as shown in FIGS. 3A-3G, along with any additional integrated circuit design or data (if applicable), into a second design structure 490. Design structure 490 resides on a storage medium in a data format used for the exchange of layout data of integrated circuits (e.g. information stored in a GDSII (GDS2), GL1, OASIS, or any other suitable format for storing such design structures). Design structure 490 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 3A-3G. Design structure 490 may then proceed to a stage 495 where, for example, design structure 490: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A circuit comprising a FET and a shallow trench capacitor, wherein the FET comprises:
   a gate stack, the gate stack comprising a high-K dielectric layer and a metal layer, the metal layer disposed on the high-K dielectric layer, and wherein the shallow trench capacitor comprises;
   a trench extending into a surface of a substrate and having a depth (d) and a width (w), wherein the depth (d) of the trench is less than 5 times the width (w) of the trench;
   a cell well implanted to have a first polarity encompassing the trench;
   the trench is filled with an insulating layer followed by a conductive layer, wherein the insulating layer comprises a layer of the same high-K dielectric used in the high-K dielectric layer of the gate stack of the FET, and wherein the conductive layer comprises a layer of the same metal used in the metal layer of the gate stack of the FET and wherein is both the high-K dielectric layer and the metal layer are patterned so as to have a portion located over the trench;
   and
   source/drain implantations in the substrate on opposite sides of the trench and having the same polarity as the cell well.

2. The circuit of claim 1, wherein:
   the trench has a depth (d) of approximately 200-300 nm, and a width (w) of at least 100 nm.

3. The circuit of claim 1, wherein:
   the conductive layer further comprises a poly layer overlying the metal layer.

4. A design structure embodied in a machine readable medium for designing, manufacturing, or testing a design, the design structure comprising a FET and a shallow trench capacitor, wherein the FET comprises:
- a gate stack, the gate stack comprising a high-K dielectric layer and a metal layer, the metal layer disposed on the high-K dielectric layer, and wherein the shallow trench capacitor comprises;
- a trench extending into a surface of a substrate and having a depth (d) and a width (w), wherein the depth (d) of the trench is less than 5 times the width (w) of the trench;
- a cell well implanted to have a first polarity encompassing the trench;
- the trench is filled with an insulating layer followed by a conductive layer, wherein the insulating layer comprises a layer of the same high-K dielectric used in the high-K dielectric layer of the gate stack of the FET, and wherein the conductive layer comprises a layer of the same metal used in the metal layer of the gate stack of the FET and wherein is both the high-K dielectric layer and the metal layer are patterned so as to have a portion located over the trench;
- and
- source/drain implantations in the substrate on opposite sides of the STI trench and having the same polarity as the cell well, and wherein the design structure is in the form of a hardware-description language.

5. The design structure of claim 4 wherein the design structure comprises a netlist, which describes the design.

6. The design structure of claim 4 wherein the design structure resides on storage medium as a data format used for the exchange of layout data of integrated circuits.

7. The design structure of claim 4 wherein the design structure includes at least one of test data files, characterization data, verification data, or design specifications.

* * * * *